US010475984B2

United States Patent
Umeda et al.

(10) Patent No.: US 10,475,984 B2
(45) Date of Patent: Nov. 12, 2019

(54) ALUMINUM NITRIDE PIEZOELECTRIC THIN FILM, PIEZOELECTRIC MATERIAL, PIEZOELECTRIC COMPONENT, AND METHOD FOR MANUFACTURING ALUMINUM NITRIDE PIEZOELECTRIC THIN FILM

(71) Applicants: Murata Manufacturing Co., Ltd., Nagaokakyo-shi, Kyoto-fu (JP); NATIONAL INSTITUTE OF ADVANCED INDUSTRIAL SCIENCE AND TECHNOLOGY, Chiyoda-ku, Tokyo (JP)

(72) Inventors: Keiichi Umeda, Nagaokakyo (JP); Morito Akiyama, Tosu (JP); Toshimi Nagase, Tosu (JP); Keiko Nishikubo, Tosu (JP); Atsushi Honda, Nagaokakyo (JP)

(73) Assignees: MURATA MANUFACTURING CO., LTD., Nagaokakyo-Shi, Kyoto-Fu (JP); NATIONAL INSTITUTE OF ADVANCED INDUSTRIAL SCIENCE AND TECHNOLOGY, Chiyoda-Ku, Tokyo (JP)

(*) Notice: Subject to any disclaimer, the term of this patent is extended or adjusted under 35 U.S.C. 154(b) by 515 days.

(21) Appl. No.: 15/251,221

(22) Filed: Aug. 30, 2016

(65) Prior Publication Data
US 2016/0372653 A1   Dec. 22, 2016

Related U.S. Application Data

(63) Continuation of application No. PCT/JP2015/056045, filed on Mar. 2, 2015.

(30) Foreign Application Priority Data

Mar. 3, 2014 (JP) .................. 2014-040195

(51) Int. Cl.
*H01L 41/18* (2006.01)
*H01L 41/083* (2006.01)
(Continued)

(52) U.S. Cl.
CPC ............ *H01L 41/18* (2013.01); *C04B 35/581* (2013.01); *C04B 35/62218* (2013.01);
(Continued)

(58) Field of Classification Search
CPC ............... H01L 41/187; H01L 41/0831; H01L 41/0973; H01L 41/081; H01L 41/0805;
(Continued)

(56) References Cited

U.S. PATENT DOCUMENTS 7,682,709 B1   3/2010   Davis et al.
8,367,577 B2   2/2013   Satoh et al.
(Continued)

FOREIGN PATENT DOCUMENTS

JP   2009149953 A   7/2009
JP   2009228131 A   10/2009
(Continued)

OTHER PUBLICATIONS

International Search Report issued for PCT/JP2015/056045, dated May 19, 2015.
(Continued)

*Primary Examiner* — J. San Martin
(74) *Attorney, Agent, or Firm* — Arent Fox LLP

(57) ABSTRACT

A germanium-containing aluminum nitride piezoelectric film and a method for manufacturing an aluminum nitride piezoelectric film in which a germanium-containing aluminum nitride piezoelectric film is grown on a substrate by sputtering.

7 Claims, 5 Drawing Sheets

(51) Int. Cl.
| | |
|---|---|
| H01L 41/09 | (2006.01) |
| H01L 41/187 | (2006.01) |
| H01L 41/27 | (2013.01) |
| H01L 41/316 | (2013.01) |
| H03H 3/02 | (2006.01) |
| C23C 14/00 | (2006.01) |
| C23C 14/06 | (2006.01) |
| C23C 14/34 | (2006.01) |
| G10K 9/125 | (2006.01) |
| C04B 35/581 | (2006.01) |
| C23C 14/14 | (2006.01) |
| H01L 41/08 | (2006.01) |
| H03H 9/02 | (2006.01) |
| H03H 9/58 | (2006.01) |
| C04B 35/622 | (2006.01) |

(52) U.S. Cl.
CPC ...... *C23C 14/0042* (2013.01); *C23C 14/0617* (2013.01); *C23C 14/0641* (2013.01); *C23C 14/14* (2013.01); *C23C 14/3435* (2013.01); *C23C 14/3464* (2013.01); *G10K 9/125* (2013.01); *H01L 41/081* (2013.01); *H01L 41/0805* (2013.01); *H01L 41/0831* (2013.01); *H01L 41/0973* (2013.01); *H01L 41/187* (2013.01); *H01L 41/27* (2013.01); *H01L 41/316* (2013.01); *H03H 3/02* (2013.01); *H03H 9/02015* (2013.01); *H03H 9/588* (2013.01); *C04B 2235/3865* (2013.01); *C04B 2235/40* (2013.01); *H03H 2003/023* (2013.01)

(58) Field of Classification Search
CPC ............ C04B 35/581; C04B 35/62218; C23C 14/0042; C23C 14/0641; C23C 14/14
See application file for complete search history.

(56) References Cited

U.S. PATENT DOCUMENTS

| | | | |
|---|---|---|---|
| 9,246,461 | B2 | 1/2016 | Akiyama et al. |
| 2006/0163605 | A1 | 7/2006 | Miyahara |
| 2006/0183625 | A1 | 8/2006 | Miyahara |
| 2010/0209622 | A1 | 8/2010 | Satoh et al. |
| 2012/0107557 | A1 | 5/2012 | Akiyama et al. |
| 2018/0135202 | A1* | 5/2018 | Doolittle ............. C23C 14/0641 |
| 2018/0192203 | A1* | 7/2018 | Umeda ................... H01L 41/09 |
| 2019/0013458 | A1* | 1/2019 | Hill ....................... H01L 41/187 |

FOREIGN PATENT DOCUMENTS

| | | |
|---|---|---|
| JP | 2009246205 A | 10/2009 |
| JP | 2011015148 A | 1/2011 |

OTHER PUBLICATIONS

Written Opinion of the International Searching Authority issued for PCT/JP2015/056045, dated May 19, 2015.

Erik Lewin et al.; "Nanocomposite Al—Ge—N thin films and their mechanical and optical properties"; Journal of Materials Chemistry, 2012, vol. 22, pp. 16761-16773.

* cited by examiner

ALUMINUM NITRIDE PIEZOELECTRIC THIN FILM, PIEZOELECTRIC MATERIAL, PIEZOELECTRIC COMPONENT, AND METHOD FOR MANUFACTURING ALUMINUM NITRIDE PIEZOELECTRIC THIN FILM

CROSS REFERENCE TO RELATED APPLICATIONS

The present application is a continuation of International application No. PCT/JP2015/056045, filed Mar. 2, 2015, which claims priority to Japanese Patent Application No. 2014-040195, filed Mar. 3, 2014, the entire contents of each of which are incorporated herein by reference.

FIELD OF THE INVENTION

The present invention relates to a Ge-containing aluminum nitride piezoelectric thin film which can be used as a piezoelectric body, a method for manufacturing the piezoelectric thin film, and a piezoelectric material and a piezoelectric component that include the piezoelectric thin film.

BACKGROUND OF THE INVENTION

Conventionally, various methods for manufacturing a piezoelectric thin film obtained by doping in aluminum nitride and a small amount of another element have been proposed. For example, Patent Document 1 described below discloses a reaction sputtering method in which aluminum, and gallium, indium or scandium are reacted with nitrogen in an inert gas atmosphere. Patent Document 1 describes that the polarization direction is inverted by supplying, together with nitrogen, oxygen in a ratio of 0.8 mol % or more and 3.2 mol % or less.

In addition, Patent Document 2 described below discloses an aluminum nitride piezoelectric thin film having a Sc content of 0.5 to 50 at %.

Patent Document 1: JP 2009-149953 A
Patent Document 2: JP 2011-15148 A

SUMMARY OF THE INVENTION

The manufacturing method described in Patent Document 1 can provide an aluminum nitride piezoelectric thin film in which the polarization direction is opposite to a thin film growing direction. It is, however, very difficult to supply a small amount of oxygen with a high degree of accuracy. Accordingly, the method is not satisfactory in mass productivity.

On the other hand, Patent Document 2 can provide a piezoelectric property by doping scandium, which is however very expensive. Scandium is also difficult to obtain stably. Further, in Patent Document 2, since the piezoelectric thin film has a polarization direction in the film growing direction, i.e., the polarization direction of aluminum polarity (Al-polarity), a piezoelectric thin film cannot be obtained in which the polarization direction is nitrogen polarity (N-polarity) opposite to the thin film growing direction.

An object of the present invention is to provide an aluminum nitride piezoelectric thin film in which the polarization direction is nitrogen polarity (N-polarity) and which is excellent in mass productivity, and to provide a method for manufacturing the piezoelectric thin film. Another object of the present invention is to provide a piezoelectric material and a piezoelectric component that include the aluminum nitride piezoelectric thin film.

An aluminum nitride piezoelectric thin film according to the present invention is characterized by containing germanium.

In the aluminum nitride piezoelectric thin film according to the present invention, the concentration of germanium is preferably in the range of 3 to 28 at % when a total concentration of germanium and aluminum is 100 at %. In this case, the aluminum nitride piezoelectric thin film in which the polarization direction is nitrogen polarity (N-polarity) can be obtained more easily. The concentration of germanium is more preferably in the range of 4 to 21 at %. In this case, the piezoelectric property can be enhanced more effectively. The concentration of germanium is even more preferably in the range of 5 to 16 at %. In this case, the piezoelectric property can be enhanced even more effectively.

In the aluminum nitride piezoelectric thin film according to the present invention, the polarization direction is preferably nitrogen polarity (N-polarity).

In another aspect of the aluminum nitride piezoelectric thin film according to the present invention, the polarization direction is preferably a direction opposite to a thin film growing direction.

A piezoelectric material according to the present invention includes a substrate and an aluminum nitride piezoelectric thin film formed on the substrate by a deposition method, and the aluminum nitride piezoelectric thin film is an aluminum nitride piezoelectric thin film configured according to the present invention.

A piezoelectric component according to the present invention is characterized by including an aluminum nitride piezoelectric thin film configured according to the present invention.

A method for manufacturing an aluminum nitride piezoelectric thin film according to the present invention is characterized by growing the aluminum nitride piezoelectric thin film on a substrate by sputtering.

In the method for manufacturing an aluminum nitride piezoelectric thin film according to the present invention, the sputtering is preferably conducted by using a target containing Al, a target containing Ge, or an AlGe alloy target, while a nitrogen gas is supplied.

The aluminum nitride piezoelectric thin film and the method for manufacturing the aluminum nitride piezoelectric thin film according to the present invention can easily provide an aluminum nitride piezoelectric thin film in which the polarization direction is nitrogen polarity (N-polarity).

The piezoelectric material and the piezoelectric component according to the present invention include a Ge-containing aluminum nitride piezoelectric thin film configured according to the present invention, and therefore can easily provide, for example, a configuration in which a plurality of piezoelectric thin films having different polarization directions are laminated.

DESCRIPTION OF PREFERRED EMBODIMENTS OF THE INVENTION

Hereinafter, the present invention is made clear by describing specific embodiments of the present invention with reference to the drawings.

Figure 4:
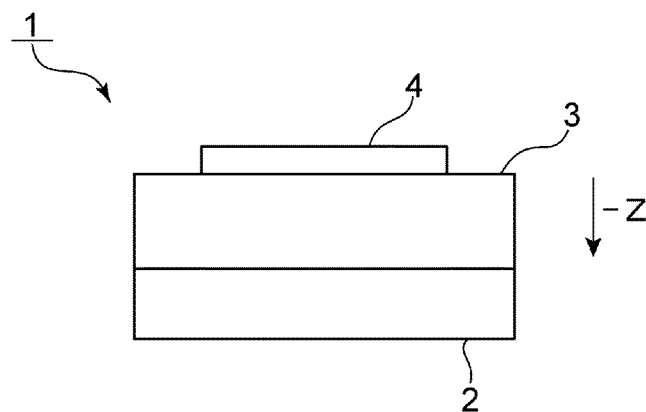
FIG. 4 is a schematic front view showing a piezoelectric component according to an embodiment of the piezoelectric component of the present invention.

FIG. 4 is a schematic front view of a piezoelectric component obtained in the first embodiment of the present invention. A piezoelectric component 1 includes a substrate 2 containing Si. A Ge-containing aluminum nitride piezoelectric thin film 3 is formed on the substrate 2. The Ge-containing aluminum nitride piezoelectric thin film 3 is formed by a sputtering method as described below. The polarization direction of the Ge-containing aluminum nitride piezoelectric thin film 3 is the arrow –Z direction shown in the drawing. Specifically, the polarization direction is nitrogen polarity (N-polarity) having a direction opposite to a thin film growing direction.

On the Ge-containing aluminum nitride piezoelectric thin film 3, an electrode 4 is formed. Although particularly not used here, at least one electrode in addition to the electrode 4 is provided for applying a voltage on the Ge-containing aluminum nitride piezoelectric thin film. Alternatively, the substrate 2 containing a semiconductor silicon may be used as one of the electrodes and the electrode 4 may be used as the other electrode.

The substrate 2 is also used as a substrate for forming the Ge-containing aluminum nitride piezoelectric thin film 3 by sputtering. Accordingly, the substrate 2 can be formed of any appropriate material. In the present embodiment, the substrate 2 contains low-resistance Si and also acts as an electrode. The substrate 2 may also contain a semiconductor other than Si. The substrate 2 may be formed of an insulator, a metal or an organic resin film. When the substrate 2 is formed of a high-resistance material, an electrode thin film may be formed between the Ge-containing aluminum nitride piezoelectric thin film 3 and the substrate 2.

The electrode 4 contains any appropriate metal such as Ag, Al, Cu, Mo, W, Ta, Pt, Ru, Rh and Ir, or contains an alloy.

As described above, the polarization direction of the Ge-containing aluminum nitride piezoelectric thin film 3 is nitrogen polarity (N-polarity) in the piezoelectric component 1 of the present embodiment.

Figure 3:
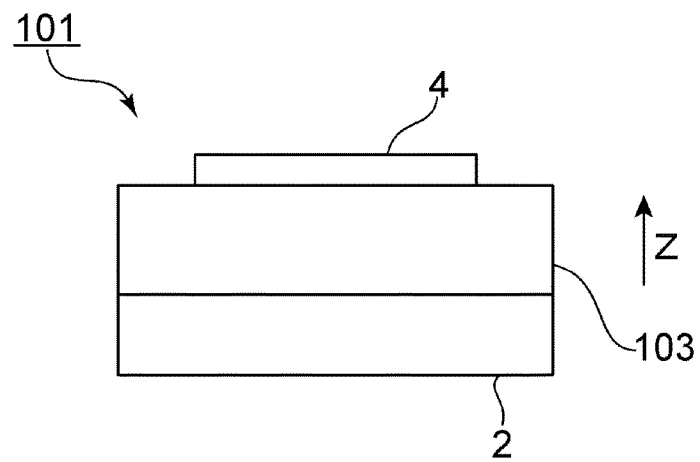
FIG. 3 is a schematic front view showing a piezoelectric component including an aluminum nitride piezoelectric thin film in which the polarization direction is aluminum polarity (Al-polarity).

Generally, when an aluminum nitride thin film is formed by sputtering, the polarization direction becomes a Z direction as in an aluminum nitride piezoelectric thin film 103 in a piezoelectric component 101 shown in FIG. 3. Specifically, the polarization direction is the same direction as the thin film growing direction. That is, the polarization direction is aluminum polarity (Al-polarity).

The present inventors have found that, by containing germanium when an aluminum nitride piezoelectric thin film is formed by a sputtering method, a piezoelectric thin film in which the polarization direction is inverted can be obtained. As described below, such a piezoelectric thin film in which the polarization direction is inverted can easily be used in a laminate of a plurality of piezoelectric thin films having different polarization directions.

An embodiment of a specific method for manufacturing the Ge-containing aluminum nitride piezoelectric thin film 3 is described below.

Figure 2:
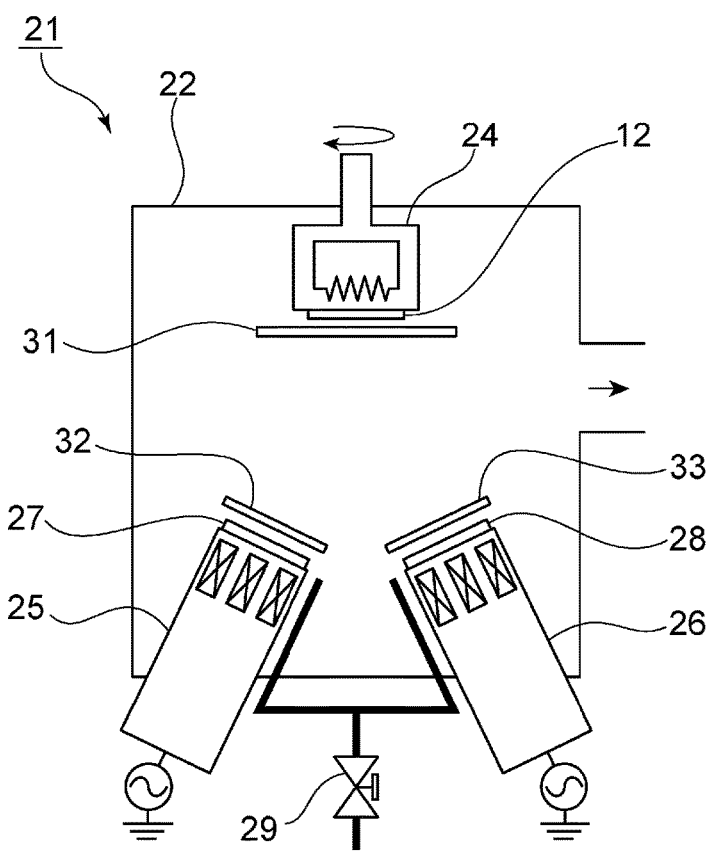
FIG. 2 is a schematic configuration view of an apparatus used for a method for manufacturing a Ge-containing aluminum nitride piezoelectric thin film according to the first embodiment of the present invention.

FIG. 2 is a schematic configuration view of an apparatus used for a method for manufacturing a Ge-containing aluminum nitride piezoelectric thin film according to the first embodiment of the present invention. A manufacturing apparatus 21 is a sputtering apparatus. The manufacturing apparatus 21 includes a chamber 22. In the chamber 22, a heating device 24 is disposed. On the lower surface of the heating device 24, a substrate 12 is attached.

High frequency power supplies 25 and 26 are provided below the substrate 12. On the high frequency power supply 25, an Al target 27 is provided. On the high frequency power supply 26, a Ge target 28 is provided.

High frequency power can be applied to the Al target 27 and the Ge target 28 from the high frequency power supplies 25 and 26, respectively.

In the meantime, a mixed gas of an Ar gas and a $N_2$ gas is supplied from the outside to the chamber 22 via a valve 29.

Below the substrate 12, directly above the Al target 27, and directly above the Ge target 28, shutters 31 to 33 are disposed, respectively.

By using the manufacturing apparatus 21, a Ge-containing aluminum nitride piezoelectric thin film can be formed on the substrate 12 by sputtering. More specifically, the substrate 12 is heated by the heating device 24, and high frequency power, with the heating state being kept, is applied to the Al target 27 and the Ge target 28 from the high frequency power supplies 25 and 26 while an Ar and $N_2$ mixed gas is supplied. Thereby, a Ge-containing aluminum nitride piezoelectric thin film can be formed on the substrate 12.

The heating temperature of the substrate 12 is not particularly limited, but may be non-heating to about 500° C. The heating temperature is more preferably 200 to 450° C.

The mixing ratio between Ar and $N_2$ depends on the target composition of the Ge-containing aluminum nitride piezoelectric thin film, but may be about 2:8 to 8:2 in the flow ratio. Preferably, the Ar:$N_2$ flow ratio is more desired to be in the range of 7:3 to 5:5. Thereby, an even more excellent piezoelectric property can be exhibited.

The gas pressure is not particularly limited, but may be about 0.1 Pa to 0.5 Pa. As an example of the present embodiment, a Ge-containing aluminum nitride piezoelectric thin film of Example 1 was formed under the following conditions.

Substrate temperature=400° C.
Ar:$N_2$ flow ratio=7:3
Gas pressure=0.18 Pa
Target composition: $Ge_{0.1}Al_{0.9}N$ A Ge-containing aluminum nitride piezoelectric thin film of Example 1 was obtained under the conditions described above. The piezoelectric constant $d_{33}$ was −5.8 pC/N. That is, the piezoelectric constant $d_{33}$ is a negative value, from which it is understood that a Ge-containing aluminum nitride piezoelectric thin film in which the polarization direction was inverted was obtained.

A Ge-containing aluminum nitride piezoelectric thin film was obtained in the same manner as in Example 1, while the power supply to the Ge target was varied. The results are shown in FIG. 5.

Figure 5:
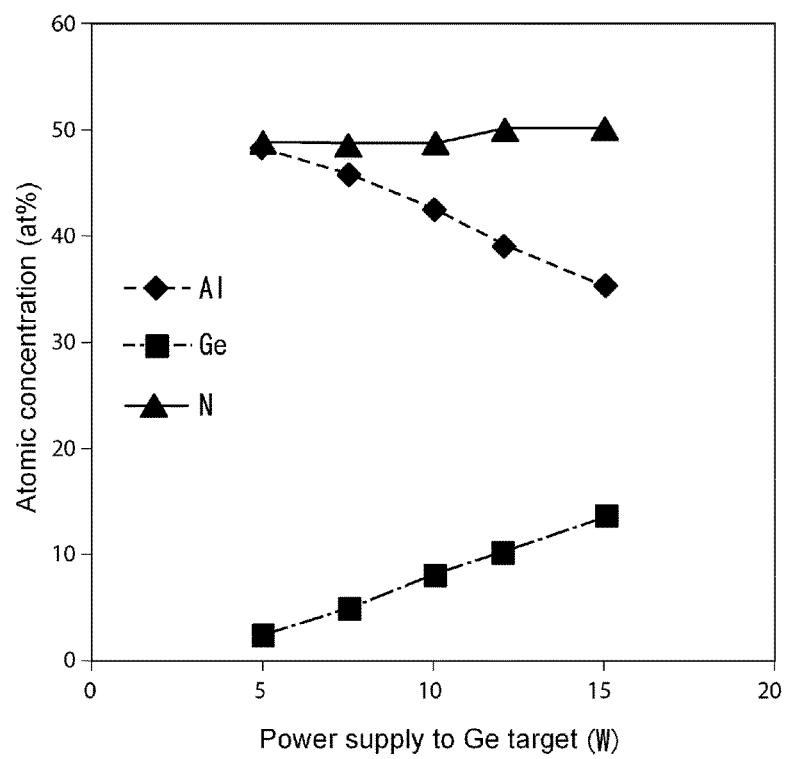
FIG. 5 is a diagram showing the relationship between the power supply to a germanium target and the atomic concentration of each element.

As is clear from FIG. 5, it is understood that when the power supply to the Ge target is varied from 5 W to 15 W, the atomic concentration of Ge increases while the atomic concentration of Al decreases, along with the increasing power supply to the Ge target. On the other hand, the concentration of N is understood to be constant. Accordingly, it is understood that the composition varies in such a manner as that part of Al is replaced by Ge.

As described above, it is understood that the atomic concentration of Ge can be adjusted by varying the power supply to the Ge target.

The atomic concentrations of Al, Ge and N described above were obtained by RBS or NRA.

The RBS is Rutherford backscattering spectrometry (RBS). In the RBS, a sample is irradiated with high speed ions. Part of the incident ions is subjected to Rutherford scattering (elastic scattering) by nuclei in the sample. The energy of the scattered ions differs according to the mass and the position of a target atom. From the energy and the yield of the scattered ions, the elemental composition in the depth direction of the sample can be obtained.

On the other hand, in the NRA, or the nuclear reaction analysis, irradiation with high speed ions causes a nuclear reaction with a light element in the sample. By detecting the α-ray or the γ-ray generated by the nuclear reaction, quantitative determination of the light element can be conducted.

For measurement of each atomic concentration in FIG. 5, the concentrations of Ge, Al, and Si were obtained by the RBS in which high speed H ions were used. In addition, the content concentration of N was measured by the NRA in which high speed H ions were used.

Figure 1:
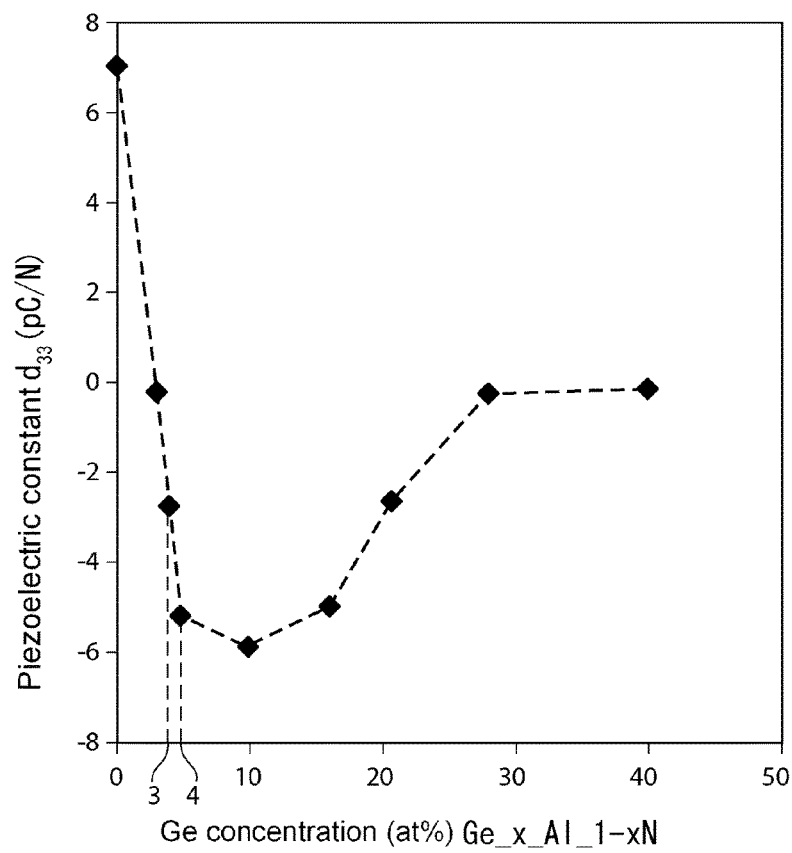
FIG. 1 is a diagram showing the relationship between the concentration of germanium in an aluminum nitride piezoelectric thin film and the piezoelectric constant $d_{33}$.

The present inventors prepared various Ge-containing aluminum nitride piezoelectric thin films in the same manner as in Example 1 described above, while varying the Ge concentration. FIG. 1 is a diagram showing the relationship between the Ge concentration and the piezoelectric constant $d_{33}$.

As is clear from FIG. 1, in the case of an aluminum nitride piezoelectric thin film having a Ge concentration of 0, that is containing no Ge, the piezoelectric constant $d_{33}$ is about 7 pC/N, a positive value.

It is understood that when Ge is contained, the piezoelectric constant $d_{33}$ rapidly shifts to a minus value. As is understood from FIG. 1, when the Ge concentration is in the range of 3 at % to 28 at %, the piezoelectric constant $d_{33}$ is a negative value. That is, as shown in FIG. 4, it is understood that the Ge-containing aluminum nitride piezoelectric thin film 3 in which the polarization direction is opposite to the thin film growing direction can be obtained. Accordingly, the Ge concentration is preferably in the range of 3 to 28 at %. In addition, as is understood from FIG. 1, when the Ge concentration is in the range of 4 to 21 at %, the absolute value of the piezoelectric constant $d_{33}$ is larger than 2 pC/N, and thus the piezoelectric property can be effectively enhanced. More preferably, it is understood that when the Ge concentration is in the range of 5 to 16 at %, the piezoelectric property can be more effectively enhanced.

It is understood from the RBS/NRA that when Ge is contained, Al is replaced by Ge. It is also understood from the document (R. D. Shannon, Acta Crystallogr., A32 (1976) 751.) that trivalent tetracoordinate Al and tetravalent tetracoordinate Ge both have an ionic radius of 0.39 angstroms and are similar to each other, and thus they are easily replaced by each other.

It was found from the first-principles calculation that Ge tends to stably take a tetravalent tetracoordinate structure and takes a stable structure when the charge compensation in that case is carried out by an Al defect with a piezoelectric constant and a crystal structure that are very similar to those obtained experimentally being able to obtained.

From these experimental data and logical analysis, it was found that such a method as Ge doping that stably affords Al deficiency is effective for forming an aluminum nitride thin film having N-polarity.

Figure 6:
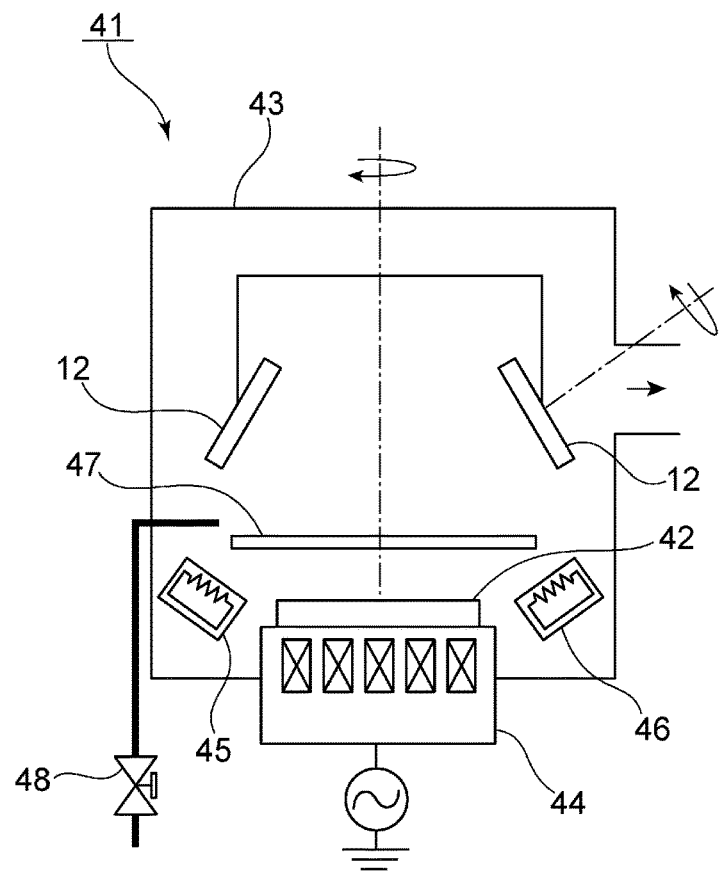
FIG. 6 is a schematic configuration view of an apparatus used for a method for manufacturing a Ge-containing aluminum nitride piezoelectric thin film according to the second embodiment of the present invention.

In the first embodiment described above, the Al target 27 and the Ge target 28 were used as shown in FIG. 2, but a GeAl alloy target 42 may be used as in the second embodiment shown in FIG. 6. In a manufacturing apparatus 41 shown in FIG. 6, a high frequency power supply 44 is disposed in a chamber 43. On the high frequency power supply 44, the GeAl alloy target 42 is placed.

In the chamber 43, heating devices 45 and 46 and a shutter 47 are disposed. Above the shutter 47, substrates 12 and 12 are disposed. The chamber 43 is configured to be supplied thereto with an Ar and $N_2$ mixed gas via a valve 48 outside the chamber 43.

As in the present embodiment, a single target of the GeAl alloy target may be used as a target. Alternatively, Ge pellets may be placed on an Al target, or an Al target may be holed to have Ge pellets embedded therein. In such a configuration, it is possible to easily and uniformly form a Ge-containing aluminum nitride piezoelectric thin film on a large size wafer such as a 6- or 8-inch size wafer. Accordingly, a Ge-containing aluminum nitride piezoelectric thin film having a relatively large area can be easily provided.

Also in the second embodiment, by setting the Ge concentration in the above specific range as described above, a Ge-containing aluminum nitride piezoelectric thin film in which the polarization direction is inverted can be provided similarly to the manufacturing method in the first embodiment.

In the manufacturing method of Patent Document 1 described above, it is difficult to supply a small amount of oxygen with a high degree of accuracy. In contrast, as is clear from the first and second embodiments, such a troublesome step as the supply of a small amount of a gas is not necessary in the method for manufacturing an aluminum nitride piezoelectric thin film of the present invention. Accordingly, a Ge-containing aluminum nitride piezoelectric thin film in which the polarization direction is inverted can be easily mass-produced.

Figure 7:
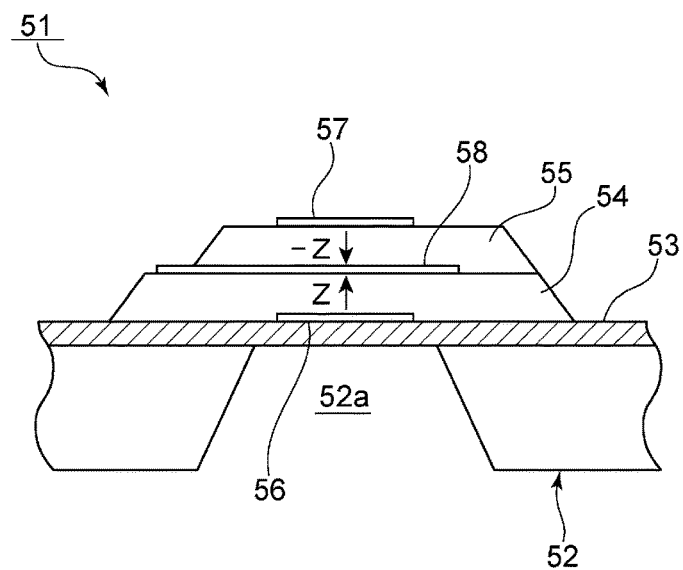
FIG. 7 is a partially cut-away front sectional view showing a structural example of the piezoelectric component of the present invention.

FIG. 7 is a partially cut-away front sectional view showing a structural example of a piezoelectric component suitably including the Ge-containing aluminum nitride piezoelectric thin film of the present invention. A piezoelectric thin film filter 51 includes a base plate 52. The base plate 52 is provided with a hollow 52a. Above the hollow 52a, a support film 53, a first piezoelectric thin film 54, and a second piezoelectric thin film 55 are laminated in this order. Under the lower surface of the first piezoelectric thin film 54, a lower electrode 56 is disposed. Above the second piezoelectric thin film 55, an upper electrode 57 is provided. Between the first piezoelectric thin film 54 and the second piezoelectric thin film 55, an electrode 58 is provided. The polarization direction of the first piezoelectric thin film 54 is the arrow Z direction, while the polarization direction of the second piezoelectric thin film 55 is the arrow −Z direction. When such a piezoelectric thin film filter 51 is obtained, the Ge-containing aluminum nitride piezoelectric thin film described above can be suitably used as the second piezoelectric thin film 55.

As the first piezoelectric thin film 54, an aluminum nitride piezoelectric thin film containing no Ge may be formed by sputtering. Accordingly, the first and second piezoelectric thin films 54 and 55 having different polarization directions can be easily formed.

Figure 8:
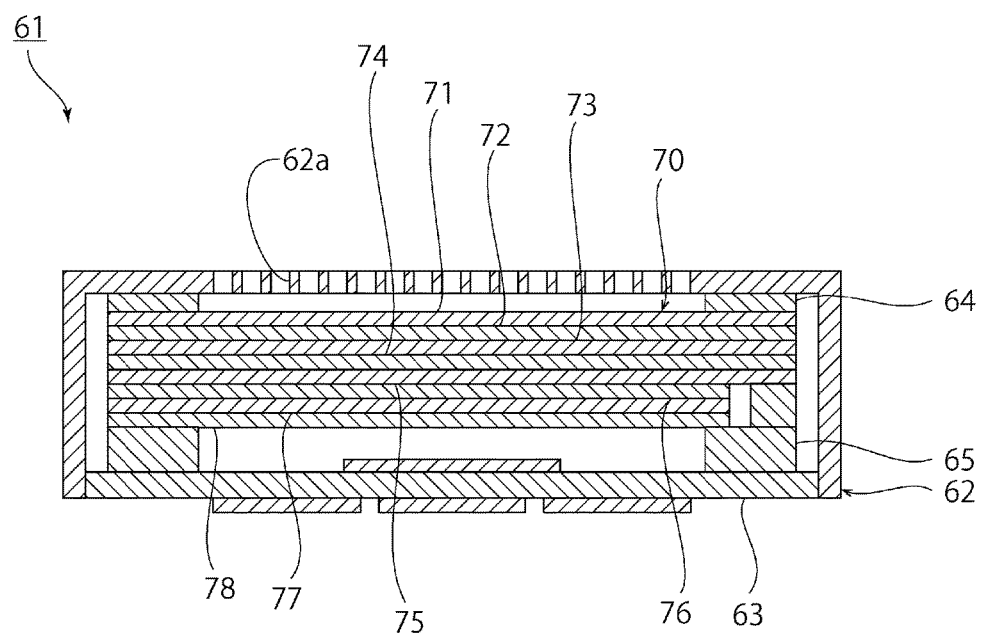
FIG. 8 is a front sectional view showing another structural example of the piezoelectric component of the present invention.

FIG. 8 is a front sectional view showing another structural example of a piezoelectric component suitably including the Ge-containing aluminum nitride piezoelectric thin film of the present invention. An acoustic element 61 shown in FIG. 8 includes a case 62. The case 62 has an aperture opening downward. The aperture opening downward is closed by abase plate 63. On the upper surface of the case 62, a plurality of sound emission holes 62*a* is provided.

In the case 62, a laminated piezoelectric element 70 is installed through support parts 64 and 65. The laminated piezoelectric element 70 has a first laminated part including an electrode 71, a vibration film 72, a piezoelectric layer 73, and an electrode 74 laminated in this order from the top, and has a second laminated part that is disposed under the first laminated part and includes an electrode 75, a piezoelectric layer 76, a vibration film 77, and an electrode 78 laminated in this order from the top. The polarization direction of the piezoelectric layer 73 and the polarization direction of the piezoelectric layer 76 are opposite to each other in the thickness direction. Such an acoustic element 61 can be easily prepared by using a Ge-containing aluminum nitride piezoelectric thin film of the present invention and an aluminum nitride piezoelectric thin film in which the polarization direction is the thin film growing direction as the piezoelectric layers 73 and 76.

The present invention is not limited to the structural examples shown in FIGS. 7 and 8, but can be widely used for various piezoelectric components having piezoelectric thin films with polarization directions opposing, such as piezoelectric vibrators, piezoelectric resonators, piezoelectric actuators, and piezoelectric sensors.

DESCRIPTION OF REFERENCE SYMBOLS 1,101 . . . Piezoelectric component
2 . . . Substrate
3 . . . Ge-containing aluminum nitride piezoelectric thin film
4 . . . Electrode
12 . . . Substrate
21 . . . Manufacturing apparatus
22 . . . Chamber
24 . . . Heating device
25,26 . . . High frequency power supply
27 . . . Al target
28 . . . Ge target
29 . . . Valve
31~33 . . . Shutter
41 . . . Manufacturing apparatus
42 . . . GeAl alloy target
43 . . . Chamber
44 . . . High frequency power supply
45,46 . . . Heating device
47 . . . Shutter
48 . . . Valve
51 . . . Piezoelectric thin film filter
52 . . . Base plate
52*a* . . . Hollow
53 . . . Support film
54,55 . . . First and second piezoelectric thin films
56 . . . Lower electrode
57 . . . Upper electrode
58 . . . Electrode
61 . . . Acoustic element
62 . . . Case
62*a* . . . Sound emission hole
63 . . . Base plate
64,65 . . . Support part
70 . . . Laminated piezoelectric element
71 . . . Electrode
72,77 . . . Vibration film
73,76 . . . Piezoelectric layer
74,75,78 . . . Electrode
103 . . . Aluminum nitride piezoelectric thin film

The invention claimed is:

1. A piezoelectric film containing aluminum nitride and germanium, wherein a polarization direction of the piezoelectric film is a nitrogen polarity, and the polarization direction is a direction opposite to a film growing direction.

2. The piezoelectric film according to claim 1, wherein a concentration of the germanium is in a range of 3 to 28 at % when a total concentration of the germanium and aluminum is 100 at %.

3. The piezoelectric film according to claim 2, wherein the concentration of the germanium is in a range of 4 to 21 at %.

4. The piezoelectric film according to claim 3, wherein the concentration of the germanium is in a range of 5 to 16 at %.

5. A piezoelectric component comprising:
a substrate; and
a piezoelectric film according to claim 1 on the substrate.

6. The piezoelectric component according to claim 5, wherein the substrate contains Si.

7. The piezoelectric component according to claim 5, further comprising an electrode on the piezoelectric film.

* * * * *